US009197160B2

(12) United States Patent
Fay

(10) Patent No.: US 9,197,160 B2
(45) Date of Patent: Nov. 24, 2015

(54) METHOD AND APPARATUS FOR PERFORMING ANALOG-TO-DIGITAL CONVERSION ON MULTIPLE INPUT SIGNALS

(71) Applicant: Sony Corporation, Tokyo (JP)

(72) Inventor: Luke Fay, San Diego, CA (US)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/504,455

(22) Filed: Oct. 2, 2014

(65) Prior Publication Data

US 2015/0038100 A1   Feb. 5, 2015

Related U.S. Application Data

(63) Continuation of application No. 13/955,130, filed on Jul. 31, 2013, now Pat. No. 8,884,600.

(51) Int. Cl.
*H03M 1/12* (2006.01)
*H03D 7/16* (2006.01)

(52) U.S. Cl.
CPC .............. *H03D 7/165* (2013.01); *H03M 1/12* (2013.01); *H03M 1/122* (2013.01)

(58) Field of Classification Search
CPC ..... H03M 1/00; H03M 2201/16; H03M 1/12; H03M 2201/13; H03M 2201/1136; H03M 2201/20; H03M 2201/51
USPC ................................. 341/155, 156, 131, 139
See application file for complete search history.

(56) References Cited

U.S. PATENT DOCUMENTS

| | | | |
|---|---|---|---|
| 6,115,473 A * | 9/2000 | Takagi | ............................... 381/2 |
| 6,331,834 B1 | 12/2001 | Smith | |
| 6,516,038 B1 * | 2/2003 | Ohta et al. | .................... 375/328 |
| 6,600,795 B1 * | 7/2003 | Ohta et al. | .................... 375/343 |
| 6,683,904 B2 | 1/2004 | Linder et al. | |
| 7,558,340 B2 * | 7/2009 | Kim et al. | ..................... 375/326 |
| 8,595,783 B2 | 11/2013 | Dewa | |
| 8,705,933 B2 | 4/2014 | Eyer | |
| 8,839,338 B2 | 9/2014 | Eyer | |
| 8,842,974 B2 | 9/2014 | Kitazato | |
| 2009/0003501 A1 | 1/2009 | Steinbach et al. | |
| 2009/0245390 A1 * | 10/2009 | Kim et al. | ................ 375/240.26 |
| 2011/0088075 A1 | 4/2011 | Eyer | |
| 2011/0243536 A1 | 10/2011 | Eyer | |
| 2011/0246488 A1 | 10/2011 | Eyer | |
| 2011/0247028 A1 | 10/2011 | Eyer | |
| 2011/0298981 A1 | 12/2011 | Eyer | |
| 2011/0299827 A1 | 12/2011 | Eyer | |
| 2011/0302599 A1 | 12/2011 | Eyer | |

(Continued)

OTHER PUBLICATIONS

International Search Report and Written Opinion issued Aug. 25, 2014 in PCT/US14/49166 filed Jul. 31, 2014.

(Continued)

*Primary Examiner* — Jean B Jeanglaude
(74) *Attorney, Agent, or Firm* — Oblon, McClelland, Maier & Neustadt, L.L.P.

(57) ABSTRACT

A method, computer-readable storage medium, and signal processing apparatus for processing a plurality of input signals. The method includes receiving or generating a first intermediate signal and a second intermediate signal. The first and second intermediate signals are summed and the summed signals are output to a signal analog-to-digital converter having a predetermined sampling frequency.

19 Claims, 9 Drawing Sheets

(56) References Cited

U.S. PATENT DOCUMENTS

| | | |
|---|---|---|
| 2011/0302611 A1 | 12/2011 | Eyer |
| 2011/0307920 A1 | 12/2011 | Blanchard et al. |
| 2012/0044418 A1 | 2/2012 | Eyer |
| 2012/0047531 A1 | 2/2012 | Eyer |
| 2012/0050619 A1 | 3/2012 | Kitazato et al. |
| 2012/0050620 A1 | 3/2012 | Kitazato |
| 2012/0054214 A1 | 3/2012 | Yamagishi et al. |
| 2012/0054235 A1 | 3/2012 | Kitazato et al. |
| 2012/0054267 A1 | 3/2012 | Yamagishi et al. |
| 2012/0054268 A1 | 3/2012 | Yamagishi |
| 2012/0054783 A1 | 3/2012 | Yamagishi |
| 2012/0054784 A1 | 3/2012 | Kitazato et al. |
| 2012/0060197 A1 | 3/2012 | Kitahara et al. |
| 2012/0063508 A1 | 3/2012 | Hattori et al. |
| 2012/0072965 A1 | 3/2012 | Dewa |
| 2012/0081508 A1 | 4/2012 | Kitazato |
| 2012/0081607 A1 | 4/2012 | Kitazato |
| 2012/0082266 A1 | 4/2012 | Kitazato et al. |
| 2012/0084802 A1 | 4/2012 | Kitazato |
| 2012/0084824 A1 | 4/2012 | Kitazato |
| 2012/0084829 A1 | 4/2012 | Kitazato |
| 2012/0185888 A1 | 7/2012 | Eyer et al. |
| 2012/0253826 A1 | 10/2012 | Kitazato et al. |
| 2012/0274848 A1 | 11/2012 | Kitahara et al. |
| 2012/0275764 A1 | 11/2012 | Eyer |
| 2013/0024894 A1 | 1/2013 | Eyer |
| 2013/0024897 A1 | 1/2013 | Eyer |
| 2013/0031569 A1 | 1/2013 | Kitazato et al. |
| 2013/0036440 A1 | 2/2013 | Eyer |
| 2013/0055313 A1 | 2/2013 | Eyer |
| 2013/0103716 A1 | 4/2013 | Yamagishi |
| 2013/0145414 A1 | 6/2013 | Yamagishi |
| 2013/0167171 A1 | 6/2013 | Kitazato et al. |
| 2013/0191860 A1 | 7/2013 | Kitazato et al. |
| 2013/0198768 A1 | 8/2013 | Kitazato |
| 2013/0201399 A1 | 8/2013 | Kitazato et al. |
| 2013/0205327 A1 | 8/2013 | Eyer |
| 2013/0212634 A1 | 8/2013 | Kitazato |
| 2013/0215327 A1 | 8/2013 | Kitazato et al. |
| 2013/0250173 A1 | 9/2013 | Eyer |
| 2013/0254824 A1 | 9/2013 | Eyer |
| 2013/0282870 A1 | 10/2013 | Dewa et al. |
| 2013/0283311 A1 | 10/2013 | Eyer |
| 2013/0283328 A1 | 10/2013 | Kitazato |
| 2013/0291022 A1 | 10/2013 | Eyer |
| 2013/0291049 A1 | 10/2013 | Kitazato |
| 2013/0340007 A1 | 12/2013 | Eyer |
| 2014/0013347 A1 | 1/2014 | Yamagishi |
| 2014/0013379 A1 | 1/2014 | Kitazato et al. |
| 2014/0020038 A1 | 1/2014 | Dewa |
| 2014/0020042 A1 | 1/2014 | Eyer |
| 2014/0040965 A1 | 2/2014 | Kitazato et al. |
| 2014/0040968 A1 | 2/2014 | Kitazato et al. |
| 2014/0043540 A1 | 2/2014 | Kitazato et al. |
| 2014/0053174 A1 | 2/2014 | Eyer et al. |
| 2014/0067922 A1 | 3/2014 | Yamagishi et al. |
| 2014/0099078 A1 | 4/2014 | Kitahara et al. |
| 2014/0122528 A1 | 5/2014 | Yamagishi |
| 2014/0137153 A1 | 5/2014 | Fay et al. |
| 2014/0137165 A1 | 5/2014 | Yamagishi |
| 2014/0150040 A1 | 5/2014 | Kitahara et al. |
| 2014/0157304 A1 | 6/2014 | Fay et al. |
| 2014/0173661 A1 | 6/2014 | Yamagishi |
| 2014/0186008 A1 | 7/2014 | Eyer |
| 2014/0208375 A1 | 7/2014 | Fay et al. |
| 2014/0208380 A1 | 7/2014 | Fay et al. |
| 2014/0229580 A1 | 8/2014 | Yamagishi |
| 2014/0229979 A1 | 8/2014 | Kitazato et al. |
| 2014/0253683 A1 | 9/2014 | Eyer et al. |

OTHER PUBLICATIONS

International Search Report and Written Opinion issued Aug. 25, 2014 in PCT/US14/49166.
U.S. Appl. No. 13/930,814, filed Jun. 28, 2013, Fay.
U.S. Appl. No. 13/930,880, filed Jun. 28, 2013, Fay et al.
U.S. Appl. No. 13/934,549, filed Jul. 3, 2013, Fay et al.
U.S. Appl. No. 13/934,615, filed Jul. 3, 2013, Eyer.
U.S. Appl. No. 13/955,130, filed Jul. 31, 2013, Fay.
U.S. Appl. No. 14/275,231, filed May 12, 2014, Eyer.
U.S. Appl. No. 14/295,695, filed Jun. 4, 2014, Eyer.
U.S. Appl. No. 14/457,290, filed Aug. 12, 2014, Eyer.
U.S. Appl. No. 14/458,310, filed Aug. 13, 2014, Eyer.
U.S. Appl. No. 14/490,263, filed Sep. 18, 2014, Blanchard et al.
U.S. Appl. No. 14/493,661, filed Sep. 23, 2014, Yamagishi.
U.S. Appl. No. 14/493,721, filed Sep. 23, 2014, Kitazato.

* cited by examiner

METHOD AND APPARATUS FOR PERFORMING ANALOG-TO-DIGITAL CONVERSION ON MULTIPLE INPUT SIGNALS

CROSS-REFERENCE TO RELATED APPLICATIONS

This application is a continuation of U.S. application Ser. No. 13/955,130, filed Jul. 31, 2013, the entire content is incorporated herein by reference.

BACKGROUND OF THE INVENTION

1. Field of the Invention

Embodiments described herein relate generally to using an analog-to-digital converter for multiple input signals.

2. Background

One of the biggest pieces of real-estate in a silicon chip is the analog-to-digital converter (A/D). For example, in the case of receiving out-of-band (OOB) and forward application transport (FAT) channels in a cable network, a dedicated A/D is utilized for each channel. This not only increases the silicon chip size, but also increases implementation cost.

SUMMARY OF THE INVENTION

Embodiments of the present disclosure are directed to reducing the number of A/Ds required to process multiple input signals. Further, certain embodiments of the present disclosure address the problem of increased chip size and/or implementation cost, for example, as described above.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
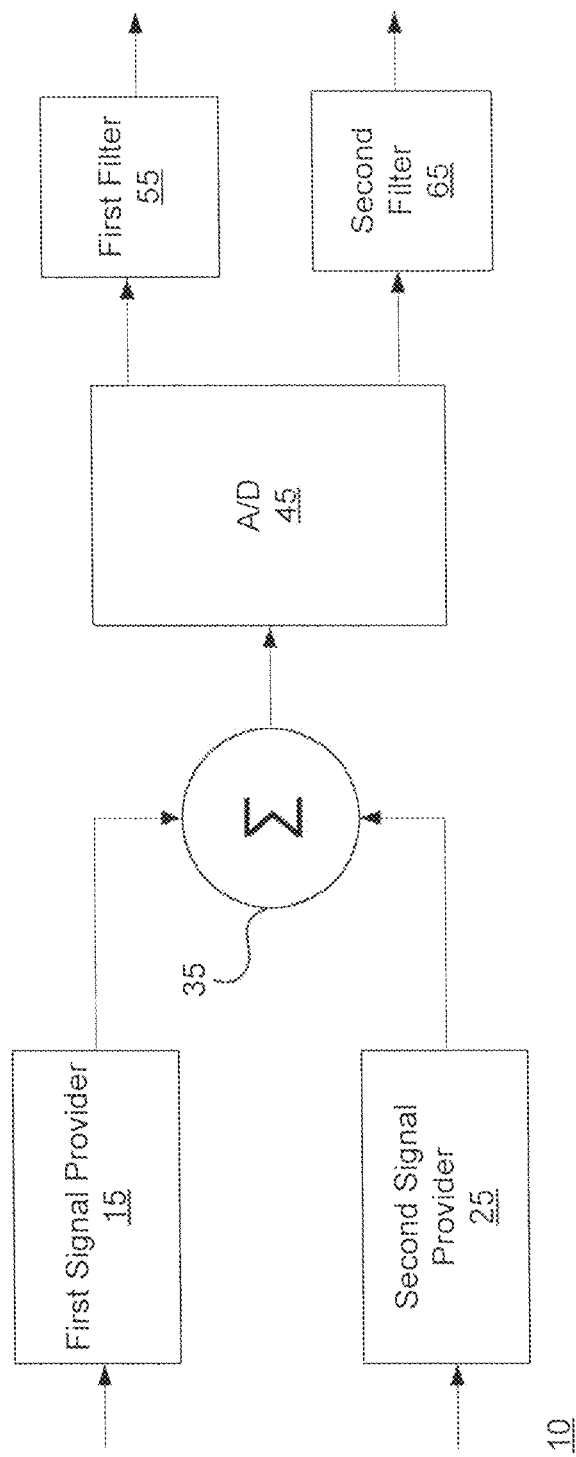
FIG. 1 illustrates an exemplary signal processing apparatus.

While the present disclosure is susceptible of embodiment in many different forms, there is shown in the drawings and will herein be described in detail specific embodiments, with the understanding that the present disclosure of such embodiments is to be considered as an example of the principles and not intended to limit the present disclosure to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program" or "computer program" or similar terms, as used herein, is defined as a sequence of instructions designed for execution on a computer system. A "program", or "computer program", may include a subroutine, a program module, a script, a function, a procedure, an object method, an object implementation, in an executable application, an applet, a servlet, a source code, an object code, a shared library/dynamic load library and/or other sequence of instructions designed for execution on a computer system.

Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Embodiments of the present disclosure are directed to reducing the number of A/Ds needed in a signal processing apparatus to process multiple input signals. The signal processing apparatus may be used for any digital demodulation method and implemented in any system which can take in two or more analog signals and process them digitally, such as in a television, set top box, cable modem, satellite receiver, cellular phone, etc. As further described below, exemplary applications include Open Cable specification signals and channel bonding.

Embodiments of the present disclosure utilize strategic placement of signal provider output signals (e.g., tuner output signals) and their intermediate frequencies (IF) with respect to sampling frequency (Fs) of an A/D to sub-sample at least two output signals with one A/D. Once sampled, filters (e.g., low-pass and band-pass filters) separate out the signals or, for example, allow for combining them in a digital demodulator (e.g., channel bonding).

In one example, all signal provider output signals are sub-sampled with a single A/D. In another example, the signal provider output signals are divided into groups, with each group being sub-sampled by a different A/D.

Although use of the same A/D for more than one input signal requires additional components (e.g., band-pass and low-pass filters), at least one of the size and the cost of the ADC typically outweighs those of the additional components. It should be noted that the embodiments disclosed herein may be applied even when implementation cost and chip size are not lowered, for example, when a simple reduction in the number of A/Ds is desired.

Certain embodiments of the present disclosure are described with respect to the television environment, such as televisions which accept cable and/or terrestrial signals. Channel bonding is present in cable systems today and could benefit from utilizing the embodiments described herein. Further, some standards bodies are considering channel bonding for terrestrial use as well.

Although certain embodiments are described using FAT and OOB channels, as well as channel bonding of terrestrial 8-level vestigial sideband modulation (8-VSB), as examples, in the television environment, embodiments of the present disclosure are applicable to any digital communication system with large downstream throughput. Typical uses cases in the United States have 6 MHz channels, however, scaling can be applied to any channel size depending on the application.

Many systems today use multiple frequencies, or channels, to send information. FIG. 1 illustrate an exemplary signal processing apparatus 10 configured to receive a radio frequency (RF) input. The signal processing apparatus 10 include a first signal provider 15, a second signal provider 25, a summing unit 35 (e.g., a combiner), an A/D 45, a first filter 55, and a second filter 65.

Although FIG. 1 only illustrates a certain number of each component, it should be noted that any number of each of the components may be included in the signal processing apparatus 10. For example, the signal processing apparatus 10 can include three or more signal providers that provide intermediate frequency signals to the summing unit 35. In this example, three separate filters separate out the output from the A/D 45 into respective processed signals. Further, although the same RF input (e.g., including OOB and FAT channels) is received by the first and second signal providers 15, 25 in FIG. 1, it should be noted that the first and second signal providers 15, 25 can receive different inputs.

The first and second signal providers 15, 25 are configured to receive or generate first and second intermediate signals, respectively, that are strategically placed in relation to each other based on factors such as sampling frequency (Fs) of the A/D, filter roll-offs, etc. In certain embodiments, the first and second intermediate signals are placed between Fs and 2Fs on the frequency spectrum, in a non-overlapping manner, such that the sampling of Fs spectrally folds down channels associated with the first and second intermediate signals between −Fs and 0 Hz. Alternatively, for spectral inversion, the desired signal could be from 0 Hz to Fs Hz.

Specifically, in certain embodiments, the first and second intermediate signals are placed between 1.5Fs and 2Fs and the digital sampling of Fs spectrally folds down channels associated with the first and second intermediate signals between −0.5Fs and 0 Hz, or between 0.5Fs and Fs. In other embodiments, the first and second intermediate signals are placed between 0.5Fs and Fs. Placing the first and second intermediate signals between 0.5Fs and Fs allows for direct sampling instead of band-pass sampling.

It should be noted that the first and second intermediate signals, and/or the desired signal, may be placed/sampled at other frequency intervals of Fs or 0.5Fs (e.g., defined by [x−1]Fs to xFs or [x−0.5]Fs to xFs, where x is any numerical value except 0).

The distance between the first and second intermediate signals can be set according to reasonable roll-off factor requirements for the first and second filters 55, 65. Exemplary reasonable roll-off factors are 0.15 and above for easy implementation.

As described above, the center frequencies of the signal provider outputs are strategically placed to properly align them in concert with the Fs of the A/D. For example, intermediate frequencies (IF) from tuners are strategically placed to allow simple demodulation of two signals with one A/D. Further, in certain embodiments, the A/D is at least capable of supporting the maximum number of effective bits needed among the received channels.

Figure 2:
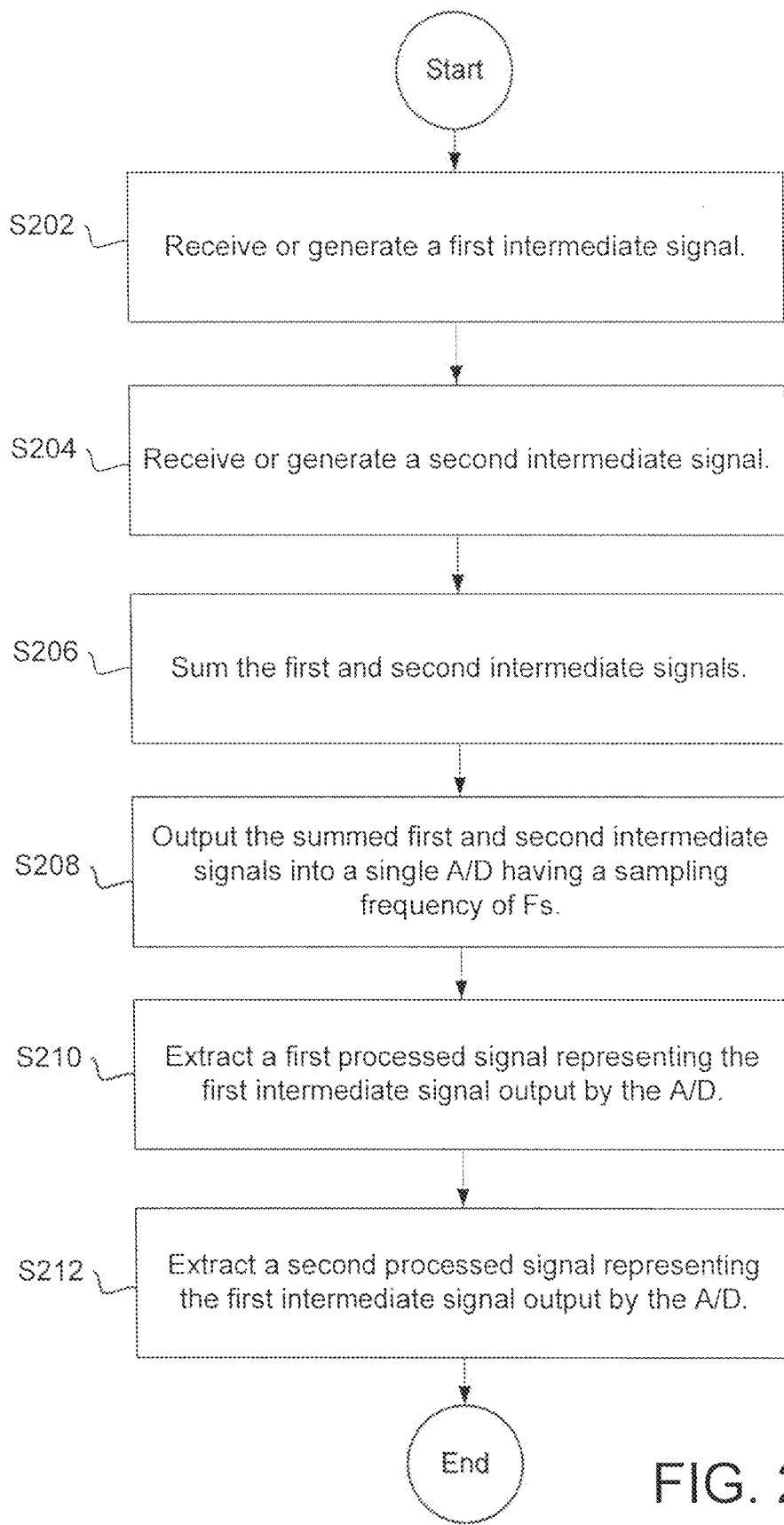
FIG. 2 illustrates a flow diagram of an exemplary method performed by the signal processing apparatus.

FIG. 2 is a flow diagram of a method performed by the signal processing apparatus 10 to perform analog-to-digital conversion on multiple input signals. At step S202, the first signal provider 15 receives or generates a first intermediate signal. For example, the first signal provider 15 extracts one of a plurality of RF input signals, generates the first intermediate signal based on the Fs of the A/D 45 and a center carrier frequency of the one of the plurality of RF input signals, and outputs the extracted one of the plurality of RF input signals to the summing unit 35. The extracted one of the plurality of RF input signals and/or generated first intermediate signal is optionally amplified. In another example, the first signal provider 15 receives an RF input signal that has the same center carrier frequency as the first intermediate signal.

At step S204, the second signal provider 25 receives or generates a second intermediate signal. For example, the second signal provider 25 extracts a different one of the plurality of RF input signals, generates the second intermediate signal based on the Fs of the A/D 45 and a center carrier frequency of the different one of the plurality of RF input signals, and outputs the extracted different one of the plurality of RF input signals to the summing unit 35. The extracted different one of the plurality of RF input signals and/or generated second intermediate signal is optionally amplified. In another example, the second signal provider 25 receives a different RF input signal that has the same center carrier frequency as the second intermediate signal.

At step S206, the summing unit 35 sums the first and second intermediate signals and outputs the summed signals to the A/D 45. The A/D 45 performs analog-to-digital conversion on the summed first and second intermediate signals and outputs first and second processed signals, which correspond to the first and second intermediate signals, respectively.

At step S208, the first filter 55 extracts the first processed signal from the output of the A/D 45. Further, at step S210, the second filter 65 extracts the second processed signal from the output of the A/D 45. The extracted first and second processed signals are further processed (e.g., demodulated in a digital demodulation process). Exemplary digital demodulation processes include Quadrature Amplitude Modulation (QAM) demodulation for cable and Phase Shift Keying (PSK) demodulation for satellite.

Figure 3A:
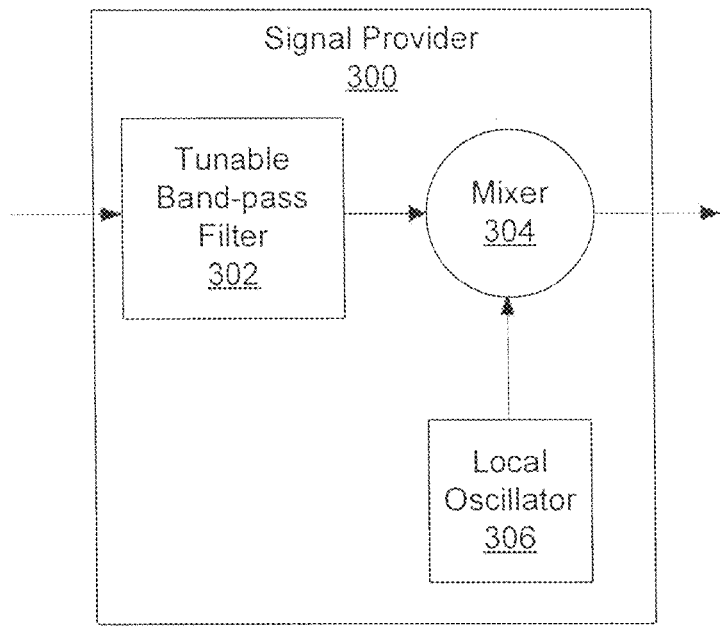
FIGS. 3A-3B illustrate exemplary signal providers.
Figure 3B:
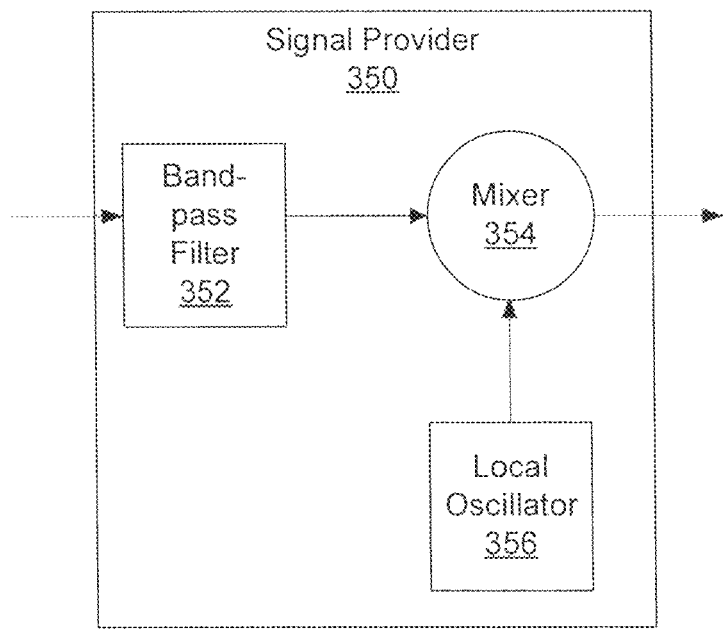

FIGS. 3A and 3B illustrate exemplary signal providers. As illustrated in FIG. 3A, a signal provider 300 (e.g., a tuner) includes a tunable band-pass filter 302, a mixer 304, and a local oscillator 306 (e.g., a tunable local oscillator such as a numerically controlled oscillator). FIG. 3B illustrates a signal provider 350 which includes a band-pass filter 352 (e.g., configured to pass through the OOB channel), mixer 354, and a local oscillator 356 (e.g., a fixed local oscillator). Further, one or more of the signal providers 300, 350 optionally include Automatic Gain Controls (AGC), for example to protect against overload (e.g., IP3 points).

Figure 4:
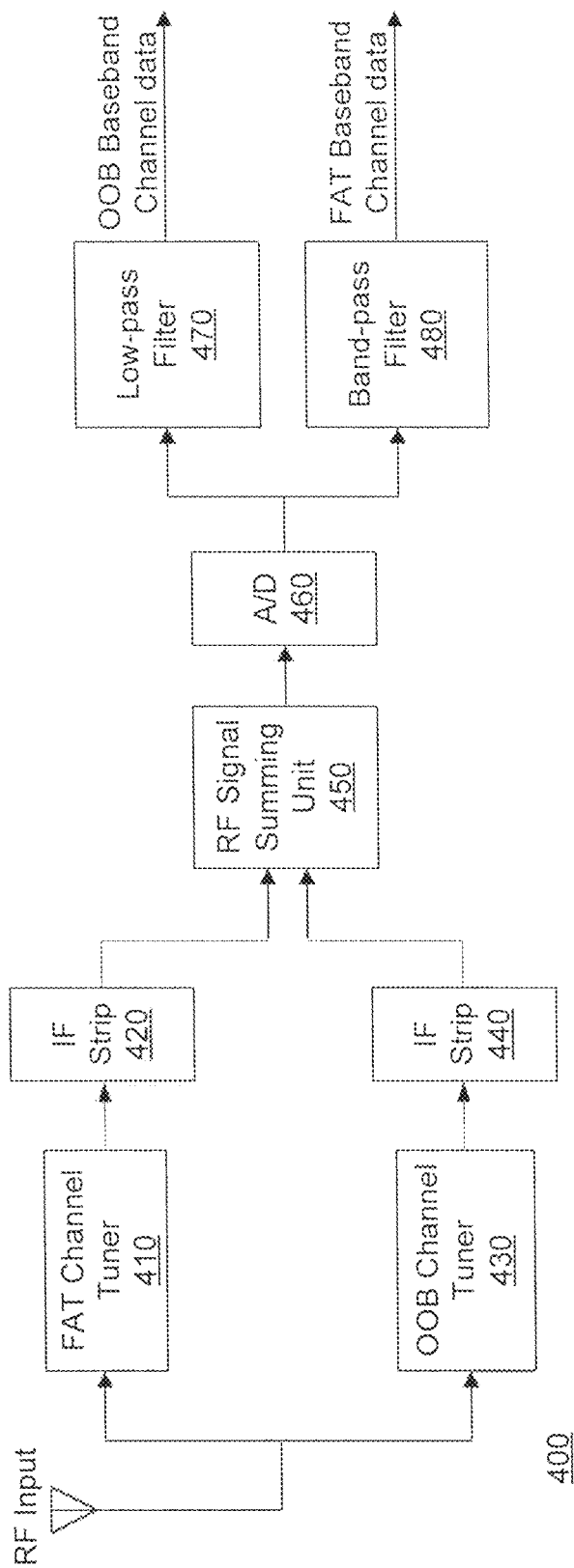
FIG. 4 illustrates a signal processing apparatus according to a first exemplary application.

FIG. 4 illustrates a signal processing apparatus 400, which is a first exemplary application of the signal processing apparatus 10. The signal processing apparatus 400 is configured to process OOB and FAT channels provided by a cable operator according to the Open Cable specification (e.g., ANSI/SCTE 07 2006 for FAT, ANSI/SCTE 55-1 2002 or ANSI/SCTE 33-2 2002 for OOB, and ANSI/SCTE 40 2004 for RF signals, which are incorporated herein by reference in their entirety). The OOB channel carries a signal used by cable operators for control in a cable television system. Receivers need this information to properly access data, and sometimes keys used to unlock protected data. This OOB content can be considered a second download channel which needs to be decoded.

As illustrated in FIG. 4, the signal processing apparatus 400 includes an FAT channel tuner 410, an FAT IF strip 420, a OOB channel tuner 430, a OOB IF strip 440, an RF summing unit 450, an A/D 460, a low-pass filter 470, and a band-pass filter 480. In one example, the FAT channel tuner 410 is implemented in accordance with the signal provider 300 illustrated in FIG. 3A, and the OOB channel tuner 420 is implemented in accordance with the signal provider 350 in FIG. 3B. In another example, the FAT channel 410 and the OOB channel tuner 420 are both implemented according to the signal provider 300 illustrated in FIG. 3A.

The FAT channel tuner 410 generates an FAT intermediate signal, and the OOB channel tuner 430 generates a OOB intermediate signal. Further, the IF strip 420, optionally amplifies and/or filters the FAT intermediate signal, and the IF strip 440 optionally amplifies and/or filters the OOB intermediate signal. The FAT and OOB intermediate signals are subsequently input into the RF summing unit 450 and then the A/D 460.

Figure 5:
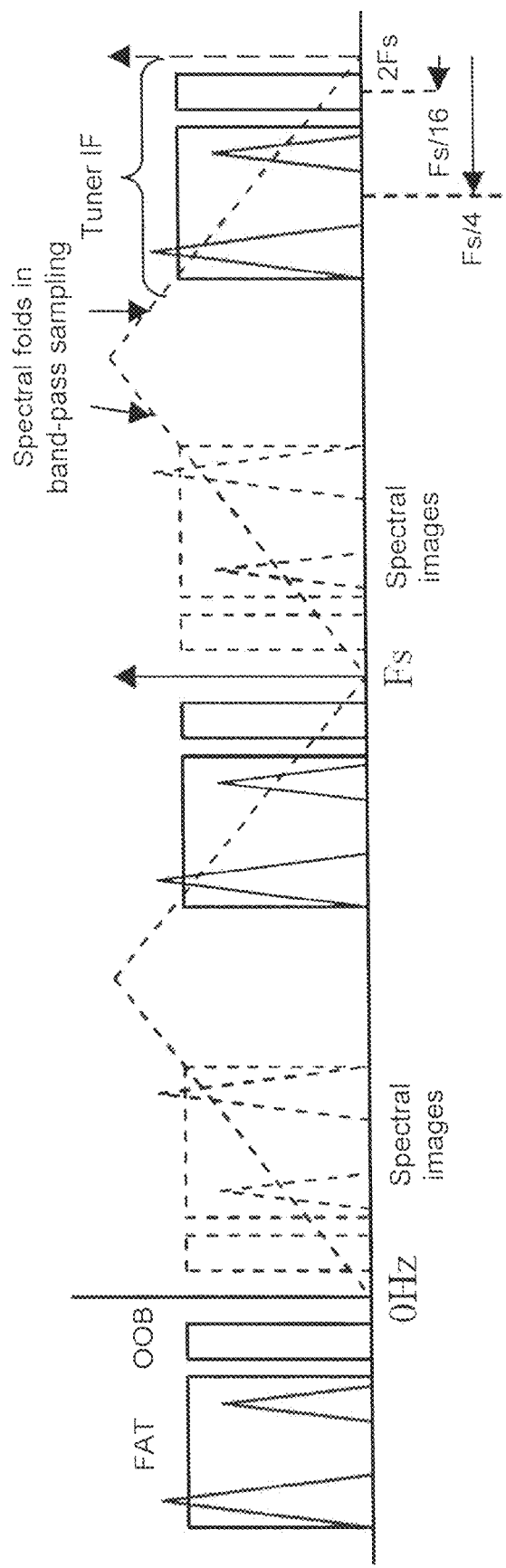
FIGS. 5-6 illustrate exemplary frequency spectrums related to the first application.

FIG. 5 illustrates an exemplary frequency spectrum utilized by the signal processing apparatus 400. As illustrated in FIG. 5, intermediate frequency signals corresponding to the FAT and OOB channels are placed in a manner that allows use of one A/D 460 and a tuner with a 43.75 MHz center intermediate frequency (IF) output to apply a simple down-conversion to baseband of the Open Cable specification OOB and FAT signals. Band-pass sampling is optionally used to have low frequency spurs.

The OOB channel is strategically placed in relation to the FAT channel to allow processing by the A/D 460. The FAT channel is placed at 2Fs−Fs/4 so that the sampling of Fs spectrally folds down the FAT channel to −Fs/4. With the FAT channel placed at this position, there is a simple multiplication by an Fs/4 cosine wave to shift the FAT channel up to baseband for processing. The multiplication of a cosine wave that is ¼ of the sampling rate translates to multiplication of +1, 0, −1, 0, +1 . . . which is an easy negating and passing through of the samples.

The OOB channel is placed at 2Fs−Fs/16 to avoid a need for two separate A/Ds. This is exactly ¼ of the placement of the FAT channel. This results in placement of the OOB channel at −Fs/16 when band-pass sampled by Fs.

In another implementation, a system clock of the OOB channel tuner 430 is set to ¼ of the system clock of the FAT channel tuner 410 which results in the same advantages (e.g., multiplying by a ¼ cosine waveform from the OOB receiver system clock). This makes the structure of the FAT channel tuner 410 and the OOB channel tuner 430 look alike and enables easy implementation.

The low-pass filter 470 extracts the OOB signal out of the output by the A/D 460. The band-pass filter 480 extracts the FAT channel out of the A/D 460 output. The low-pass filter 470 and band-pass filter 480 are implemented digitally according to certain embodiments For example, the addition of two digital filters would use up less silicon than a second A/D.

To support 256-QAM, over 8.5 effective bits are needed in the FAT channel. To support good filtering of the incoming combination signals, 6 effective bits are needed in the OOB channel. Accordingly, in one embodiment, an A/D of at least 8.5 bits (e.g., a 10-bit A/D) could be used for both channels As illustrated in FIG. 4, the A/D 460 output is split and input into the low-pass filter 470 and the band-pass filter 480.

Figure 6:
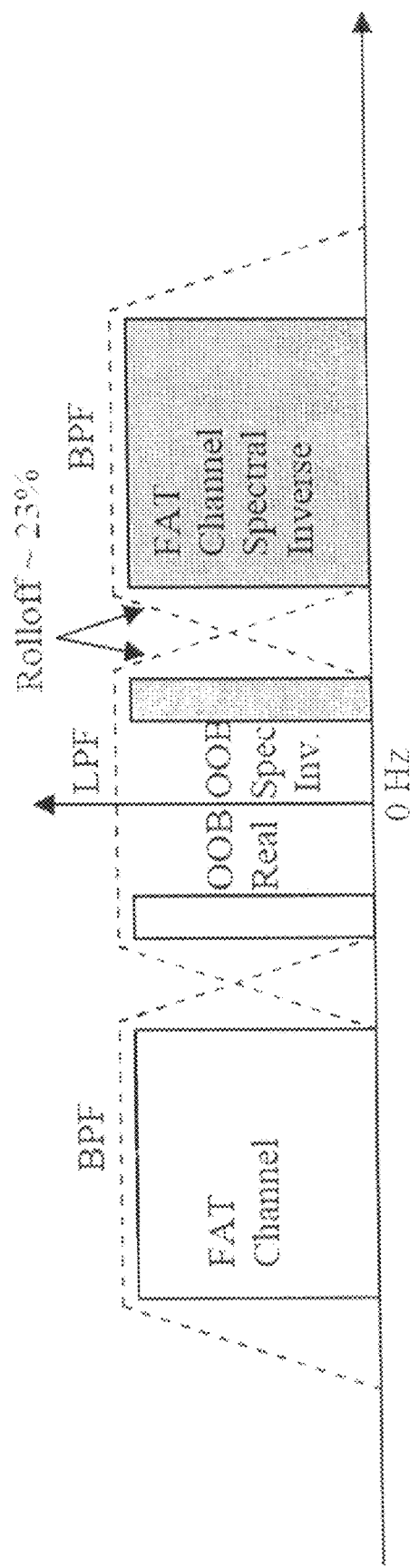

The low-pass filter 470 and band-pass filter 480 separating the output of the A/D 360 may need tight constraints. The separation between the signals depends on which mode the OOB downstream is operating in. FIG. 6 illustrates an example of the separation between the two channels.

For example, using the Digital Video Subcommittee (DVS) 178 Specification, which is incorporated herein by reference in its entirety, the maximum bandwidth of the OOB channel is 1.544 MHz to support the 3.088 Mbps signal baud rate (Rs). The FAT channel has a maximum bandwidth for 256-QAM of 5.380531 MHz (5.056491 MHz for 64-QAM).

Using these maximum bandwidths and a sampling frequency (Fs) of 25 MHz, the highest intermediate frequency from a tuner in the FAT channel is 46.4402655 MHz (i.e., 2*25−25/4 MHz=43.75 MHz center; baud rate of 256-QAM/2=2.6902655 MHz, yielding the top intermediate frequency from a tuner of 43.75+2.6902655 MHz=46.4402655 MHz). For the OOB channel, the center IF is placed at 2Fs−Fs/16=48.4375 MHz (i.e., 2*25−25/16 MHz=48.4375 MHz).

The lowest frequency of the OOB is 48.4375−Rs/2=47.6655. The difference between these channels is then 47.6655−46.4402655=1.2252345 MHz. The roll-off factor for each of the filters is determined based on a ratio between the difference of 1.2252345 MHz and the respective maximum channel bandwidths (e.g., 5.380531 MHz for the FAT channel, 1.544 MHz for the OOB channel).

Accordingly, there is a roll-off factor of 0.2277162 or about 23% for the FAT channel band-pass filter, which is a constraint that can easily be met by a digital filter. The low-pass filter has the same roll-off factor, but the cutoff frequency is tuned to allow the full OOB signal to pass through. However, the band-pass and low-pass filters may have different roll-off factors in other embodiments. These two digital filters are typically smaller than a second A/D, so the compromise between using two A/Ds versus two digital filters pays off, for example with respect to chip size.

The filter for the OOB can be a low-pass filter because there is nothing between it and 0 Hz. However, a band-pass filter can alternatively be utilized. The FAT channel is band-pass filtered to cancel out the OOB signal.

The real portions of the channel lie in the negative frequency range after the band-pass sampling at IF. After the two signals are separated, the OOB and FAT receivers can operate as if there was no combining at all. For example, regular digital demodulation methods can be applied with no alterations.

Although channel bonding is a method currently standardized in cable systems, it is also being considered for terrestrial systems. The concept is to utilize two or more channels to send information. The embodiments disclosed herein are applicable to those systems as well. However, care must be taken to pack the two channels together in concert with a sampling frequency of the single A/D which will make the operation successful, for example, as described above with respect to the first application.

In a second exemplary application, if the two channels are 6 MHz wide, one or a combination of the center IF frequencies, sampling frequency, filter roll-offs, etc., may need to be changed. For example, the sampling frequency may need to be increased.

Figure 7:
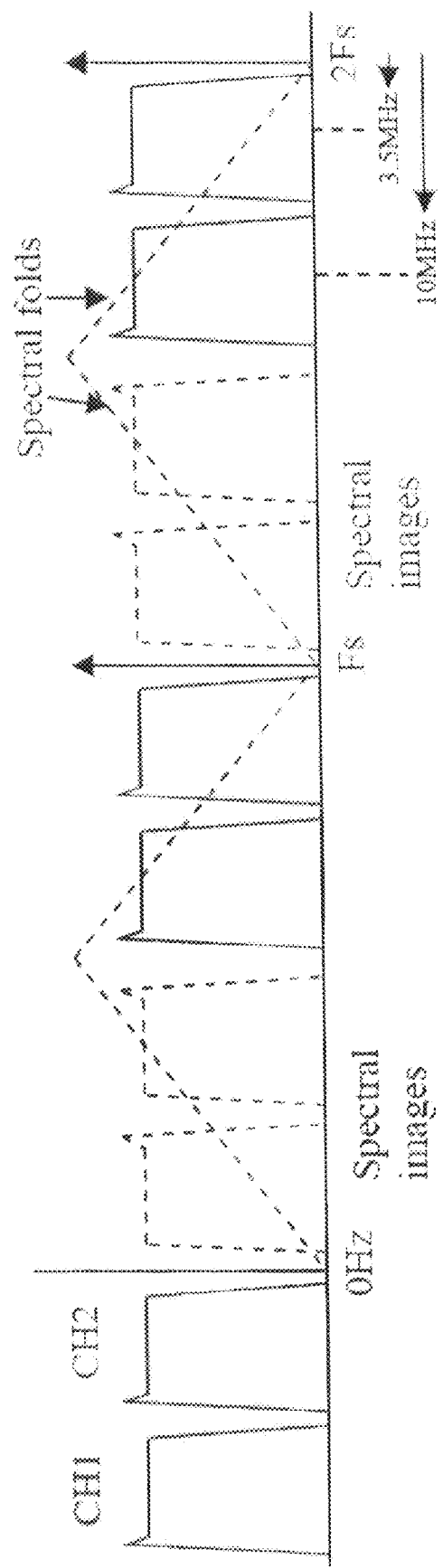
FIGS. 7-8 illustrates exemplary frequency spectrums related to a second exemplary application.

To have even distribution in frequency between the channels, one solution is illustrated in FIG. 7 with 8-VSB spectral samples and a sampling frequency of 27 MHz. A benefit to this solution is that 27 MHz is the rate of a system clock for MPEG-2 Transport, which is already implemented today.

Figure 8:
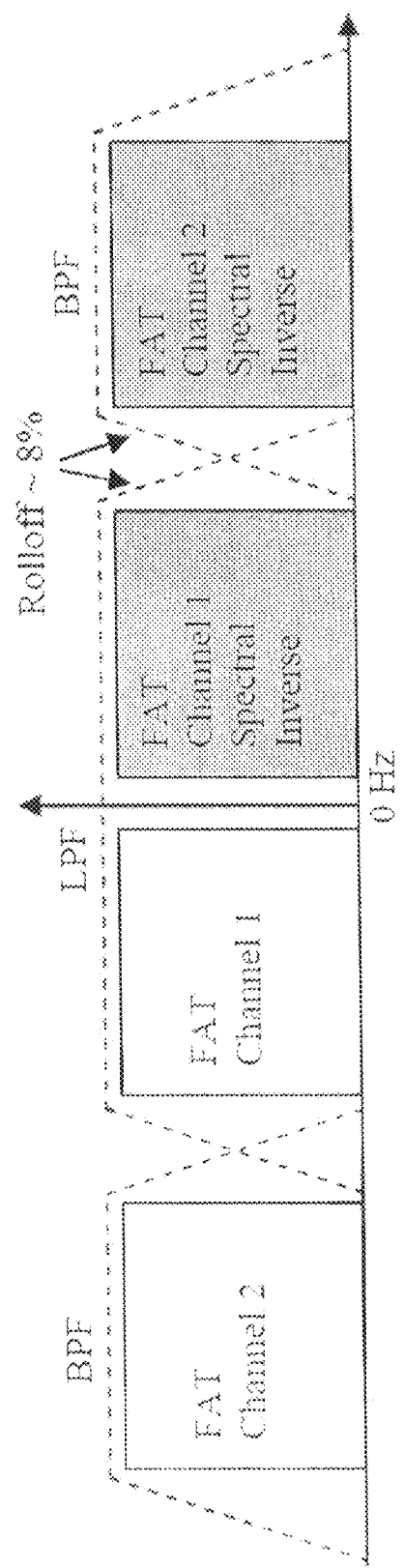

In FIG. 7, the distance between the channels is 0.5 MHz. Accordingly, the resultant required filtering is 0.5 MHz/Rs (i.e., 0.5 MHz/6 MHz)=0.08333 or about an 8% roll-off, which is illustrated in FIG. 8. Although this exemplary application requires a tighter filter than that in the first application described above, the filters are still expected to be smaller in size than a second A/D (e.g., a second 10-bit A/D).

This second application is an example of how channel bonding can be implemented in terrestrial systems. Although the numerically controlled oscillator (NCO) frequency shifting is no longer nice integer multiples of the baud rate, a single A/D, or a reduced number of A/Ds, can still be used.

Figure 9:
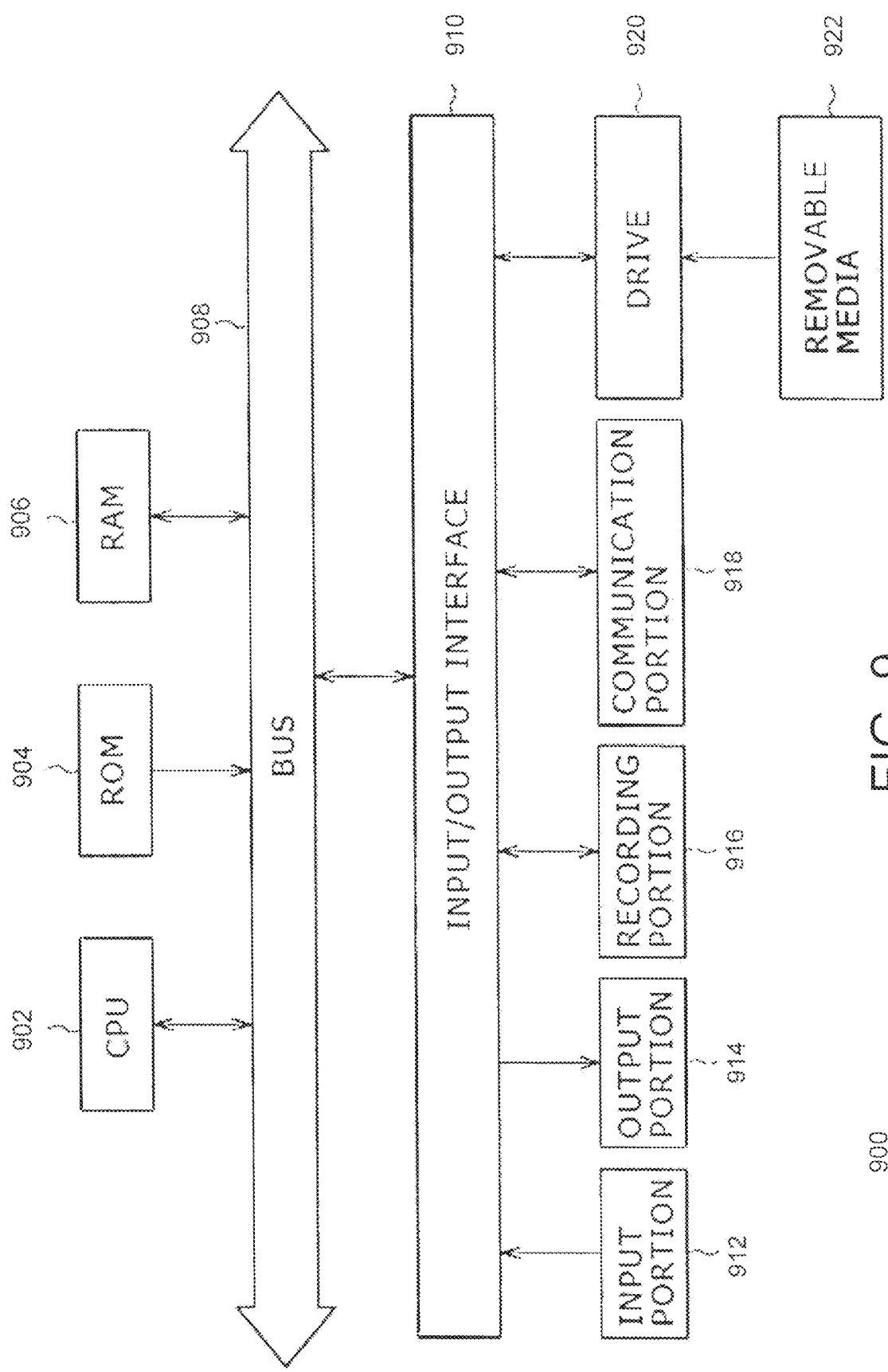
FIG. 9 is an exemplary computer.

FIG. 9 is a block diagram showing an example of a hardware configuration of a computer 900 that can be configured to control the operation of any of the signal processing apparatuses or processed described above.

As illustrated in FIG. 9, the computer 900 includes a central processing unit (CPU) 902, read only memory (ROM) 904, and a random access memory (RAM) 906 interconnected to each other via one or more buses 908. The one or more buses 908 is further connected with an input-output interface 910. The input-output interface 910 is connected with an input portion 912 formed by a keyboard, a mouse, a microphone, remote controller, etc. The input-output interface 912 is also connected to a output portion 914 formed by an audio interface, video interface, display, speaker, etc.; a recording portion 916 formed by a hard disk, a non-volatile memory, etc.; a communication portion 918 formed by a network interface, modem, USB interface, fire wire interface, etc.; and a drive 920 for driving removable media 922 such as a magnetic disk, an optical disk, a magneto-optical disk, a semiconductor memory, etc.

According to one embodiment, the CPU 902 loads one or more programs stored in the recording portion 916 into the RAM 906 via the input-output interface 910 and the bus 908, and then executes a program configured to control the operation of any of the signal processing apparatuses or processed described above. The recording portion 916 is for example a non-transitory computer-readable storage medium. It is noted that the term "non-transitory" is a limitation of the medium itself (i.e., tangible, not a signal) as opposed to a limitation on data storage persistency (e.g., RAM vs. ROM).

As noted above, embodiments of the present disclosure are directed to reducing the number of A/Ds required to process multiple input signals. By reducing the number of A/Ds, it is possible to lower at least one of implementation cost and chip size.

According to certain embodiments of the present disclosure, not only can channels be combined but filters can be individually controlled to turn on/off the functionality of channel combining (e.g., signal is present or not). This also allows for less power to be used as only one A/D is in operation. Accordingly, the present disclosure provides a low cost way to implement channel bonding functions.

As described above, one of the biggest pieces of real-estate in a silicon chip is the A/D. Some systems are even using 4096-quadrature amplitude modulation (QAM) which requires a 12 or 14-bit A/D. That only increases the size and cost of these A/Ds and, depending on the timing accuracy needed, the sampling frequency could be quite high.

Further, some cable operators now use channel bonding (e.g., DOCSIS 3.0, which is incorporated herein by reference in its entirety) options available to increase data download speeds, by increasing throughput, to gain fast download of content. To support this, two tuners and two A/Ds along with two demodulators are utilized. Thus, the cost of implementation is high. The present disclosure provide a new architecture for reducing this cost. Further, even if channel bonding is not used, there is an out-of-band (OOB) signal used by cable operators for control of the system, as described above.

Although embodiments of the present disclosure are discussed with respect to channels in a cable television network or terrestrial broadcasts, the present disclosure is applicable to other RF signals such as radio station broadcasts, satellite broadcasts, and any other digital communication method such as those with large downstream throughputs.

The various processes discussed above need not be processed chronologically and/or in the sequence depicted as flowcharts; the steps may also include those processed in parallel or individually (e.g., in paralleled or object-oriented fashion).

Also, the programs may be processed by a single computer or by a plurality of computers on a distributed basis. The programs may also be transferred to a remote computer or computers for execution.

Furthermore, in this specification, the term "system" means an aggregate of a plurality of component elements (apparatuses, modules (parts), etc.). All component elements may or may not be housed in a single enclosure. Therefore, a plurality of apparatuses each housed in a separate enclosure and connected via a network are considered a system, and a single apparatus formed by a plurality of modules housed in a single enclosure are also regarded as a system.

Also, it should be understood that this technology when embodied is not limited to the above-described embodiments and that various modifications, variations and alternatives may be made of this technology so far as they are within the spirit and scope thereof.

Also, each of the steps explained in reference to the above-described flowcharts may be executed not only by a single apparatus but also by a plurality of apparatuses in a shared manner.

Furthermore, if one step includes a plurality of processes, these processes included in the step may be performed not only by a single apparatus but also by a plurality of apparatuses in a shared manner.

Numerous modifications and variations of the present disclosure are possible in light of the above teachings. It is therefore to be understood that within the scope of the appended claims, the present disclosure may be practiced otherwise than as specifically described herein.

The above disclosure also encompasses the embodiments noted below.

(1) A method of a signal processing apparatus for processing a plurality of input signals, the method including receiving or generating a first intermediate signal; receiving or generating a second intermediate signal; summing the first and second intermediate signals; and outputting the summed first and second intermediate signals into a single analog-to-digital converter (A/D) having a predetermined sampling frequency (Fs).

(2) The method of feature (1), in which the first and second intermediate signals are generated based on the Fs.

(3) The method of feature (1) or (2), in which the step of receiving or generating a first intermediate signal includes receiving an RF input including a plurality of RF signals; extracting one of the plurality of RF signals; and generating the first intermediate signal based on the Fs and a center carrier frequency of the one of the plurality of RF signals.

(4) The method of any of features (1) to (3), in which the step of receiving or generating a second intermediate signal includes receiving an RF input including a plurality of RF signals; extracting a different one of the plurality of RF signals; and generating the second intermediate signal based on the Fs and a center carrier frequency of the different one of the plurality of RF signals.

(5) The method of feature (3) or (4), in which the extracted one of the plurality of RF signals is carried in a forward application transport (FAT) channel.

(6) The method of feature (4) to (5), in which the extracted different one of the plurality of RF signals is carried in an out-of-band (OOB) channel.

(7) The method of any of features (1) to (6), in which the first intermediate signal has a center frequency of 2Fs−Fs/4, and the second intermediate signal has a center frequency of 2Fs−Fs/16.

(8) The method of any of features (1) to (7), further including extracting, by a first filter, a first processed signal representing the first intermediate signal output by the A/D; and extracting, by a second filter, a second processed signal representing the second intermediate signal output by the A/D.

(9) The method of any of feature (1) to (8), in which at least one of the first and second intermediate signals corresponds to a digital television signal.

(10) A non-transitory computer-readable storage medium having embedded therein instructions which, when executed by a processor, cause the processor to control a signal processing apparatus to perform the method of any of features (1) to (9).

(11) A signal processing apparatus, including a first signal provider configured to receive or generate a first intermediate signal; a second signal provider configured to receive or generate a second intermediate signal; a combiner configured to sum the first and second intermediate signals; and a single analog-to-digital converter (A/D) having a predetermined sampling frequency (Fs), the single A/D being configured to perform analog-to-digital conversion of the summed first and second intermediate signals.

(12) The signal processing apparatus of feature (11), in which the first and second intermediate signals are generated based on the Fs.

(13) The signal processing apparatus of feature (11) or (12), in which the first signal provider is configured to receive an RF input including a plurality of RF signals, extract one of the plurality of RF signals, and generate the first intermediate signal based on the Fs and a center carrier frequency of the one of the plurality of RF signals.

(14) The signal processing apparatus of any of features (11) to (13), in which the second signal provider is configured to receive an RF input including a plurality of RF signals, extract a different one of the plurality of RF signals, and generate the second intermediate signal based on the Fs and a center carrier frequency of the different one of the plurality of RF signals.

(15) The signal processing apparatus of feature (13) or (14), in which the extracted one of the plurality of RF signals is carried in a forward application transport (FAT) channel.

(16) The signal processing apparatus of feature (14) or (15), in which the extracted different one of the plurality of RF signals is carried in an out-of-band (OOB) channel.

(17) The signal processing apparatus of any of features (11) to (16), in which the first intermediate signal has a center frequency of 2Fs−Fs/4, and the second intermediate signal has a center frequency of 2Fs−Fs/16.

(18) The signal processing apparatus of any of features (11) to (17), further including a first filter configured to receive the converted summed first and second intermediate signals, and output a first processed signal representing the first intermediate signal output by the A/D; and a second filter configured to receive the converted summed first and second intermediate signals, and output a second processed signal representing the second intermediate signal output by the A/D.

(19) The signal processing apparatus of any of features (11) to (18), in which at least one of the first and second intermediate signals corresponds to a digital television signal.

The invention claimed is:

1. A method of a signal processing apparatus for processing a plurality of signals, the method comprising:
   receiving an output signal from a single analog-to-digital converter (A/D);
   extracting, by circuitry of the signal processing apparatus, a first signal from the output signal;
   extracting, by the circuitry, a second signal from the same output signal;
   demodulating, by the circuitry, the first signal extracted from the output signal; and
   demodulating, by the circuitry, the second signal extracted from the same output signal.

2. The method according to claim 1, wherein
   the first signal corresponds to a third signal carried in a forward application transport (FAT) channel, and
   the second signal corresponds to a fourth signal carried in an out-of-band (OOB) channel.

3. The method according to claim 1, further comprising:
   summing first and second intermediate signals, which correspond to the first and second signal respectively; and
   outputting the summed first and second intermediate signals into the single A/D.

4. The method according to claim 3, wherein
   the first and second intermediate signals are associated with different channels placed within a predetermined sampling frequency (Fs) of the A/D, in a non-overlapping manner, such that the sampling of Fs spectrally folds down the channels associated with the first and second signals between −Fs and 0 Hz or 0 Hz to Fs on the frequency spectrum.

5. The method according to claim 3, wherein
   the first and second intermediate signals are associated with different channels placed within half of a predetermined sampling frequency (Fs) of the A/D, in a non-overlapping manner, such that the sampling of Fs spectrally folds down the channels associated with the first and second signals between −0.5Fs and 0 Hz or 0.5 Fs and Fs on the frequency spectrum.

6. The method according to claim 3, further comprising:
   receiving an RF input including a plurality of RF signals;
   extracting one of the plurality of RF signals; and
   generating the first intermediate signal based on a predetermined sampling frequency (Fs) of the A/D and a center carrier frequency of the one of the plurality of RF signals.

7. The method according to claim 6, further comprising:
   receiving the RF input including the plurality of RF signals;
   extracting a different one of the plurality of RF signals; and
   generating the second intermediate signal based on the Fs and a center carrier frequency of the different one of the plurality of RF signals.

8. The method according to claim 3, wherein
   the first intermediate signal has a center frequency of 3Fs−Fs/4,
   the second intermediate signal has a center frequency of 2Fs−Fs/16, and the Fs is a predetermined sampling frequency of the A/D.

9. The method according to claim 3, wherein at least one of the first and second intermediate signals corresponds to a digital television signal.

10. A non-transitory computer-readable storage medium having embedded therein instructions which, when executed by a processor, cause the processor to control a signal processing apparatus to perform a method comprising:
- receiving an output signal from a single analog-to-digital converter (A/D);
- extracting a first signal from the output signal;
- extracting a second signal from the same output signal;
- demodulating the first signal extracted from the output signal; and
- demodulating the second signal extracted from the same output signal.

11. A signal processing apparatus, comprising:
circuitry configured to
- receive an output signal from a single analog-to-digital converter (A/D);
- extract a first signal from the output signal;
- extract a second signal from the same output signal;
- demodulate the first signal extracted from the output signal; and
- demodulate the second signal extracted from the same output signal.

12. The apparatus according to claim 11, wherein
the first signal corresponds to a third signal carried in a forward application transport (FAT) channel, and
the second signal corresponds to a fourth signal carried in an out-of-band (OOB) channel.

13. The apparatus according to claim 11, wherein the circuitry is further configured to:
- sum first and second intermediate signals, which correspond to the first and second signal respectively; and
- output the summed first and second intermediate signals into the single A/D.

14. The apparatus according to claim 13, wherein
the first and second intermediate signals are associated with different channels placed within a predetermined sampling frequency (Fs) of the A/D, in a non-overlapping manner, such that the sampling of Fs spectrally folds down the channels associated with the first and second signals between −Fs and 0 Hz or 0 Hz to Fs on the frequency spectrum.

15. The apparatus according to claim 13, wherein
the first and second intermediate signals are associated with different channels placed within half of a predetermined sampling frequency (Fs) of the A/D, in a non-overlapping manner, such that the sampling of Fs spectrally folds down the channels associated with the first and second signals between −0.5Fs and 0 Hz or 0.5 Fs and Fs on the frequency spectrum.

16. The apparatus according to claim 13, wherein the circuitry is further configured to:
- receive an RF input including a plurality of RF signals;
- extract one of the plurality of RF signals; and
- generate the first intermediate signal based on a predetermined sampling frequency (Fs) of the A/D and a center carrier frequency of the one of the plurality of RF signals.

17. The apparatus according to claim 16, wherein the circuitry is further configured to:
- receive the RF input including the plurality of RF signals;
- extract a different one of the plurality of RF signals; and
- generate the second intermediate signal based on the Fs and a center carrier frequency of the different one of the plurality of RF signals.

18. The apparatus according to claim 13, wherein
the first intermediate signal has a center frequency of 2Fs-Fs/4,
the second intermediate signal has a center frequency of 2Fs-Fs/16, and the Fs is a predetermined sampling frequency of the A/D.

19. The apparatus according to claim 13, wherein at least one of the first and second intermediate signals corresponds to a digital television signal.

* * * * *